(12) United States Patent
Zou et al.

(10) Patent No.: US 10,680,321 B2
(45) Date of Patent: Jun. 9, 2020

(54) ANTI-INTERFERENCE MICROWAVE ANTENNA

(71) Applicant: Gaodi Zou, Shenzhen (CN)

(72) Inventors: Gaodi Zou, Shenzhen (CN); Xin Zou, Shenzhen (CN)

(73) Assignee: Gaodi Zou, Shenzhen, Guangdong (CN)

( * ) Notice: Subject to any disclaimer, the term of this patent is extended or adjusted under 35 U.S.C. 154(b) by 0 days.

(21) Appl. No.: 16/244,116

(22) Filed: Jan. 10, 2019

(65) Prior Publication Data

US 2019/0379116 A1    Dec. 12, 2019

Related U.S. Application Data

(63) Continuation of application No. 16/127,196, filed on Sep. 10, 2018, now Pat. No. 10,263,327, which is a continuation of application No. 16/035,689, filed on Jul. 15, 2018.

(30) Foreign Application Priority Data

Jun. 11, 2018   (CN) .......................... 2018 1 0595979

(51) Int. Cl.
| | |
|---|---|
| *H01Q 1/52* | (2006.01) |
| *H01Q 5/328* | (2015.01) |
| *H01Q 21/06* | (2006.01) |
| *H01Q 21/00* | (2006.01) |
| *H01Q 9/16* | (2006.01) |

(52) U.S. Cl.
CPC ............ *H01Q 1/521* (2013.01); *H01Q 5/328* (2015.01); *H01Q 21/0075* (2013.01); *H01Q 21/065* (2013.01); *H01Q 9/16* (2013.01)

(58) Field of Classification Search
CPC .......... H01Q 1/521; H01Q 5/328; H01Q 9/16; H01Q 9/0407; H01Q 9/0421
See application file for complete search history.

(56) References Cited

U.S. PATENT DOCUMENTS

| | | | | |
|---|---|---|---|---|
| 4,126,828 A | * | 11/1978 | Kumagai | ............. H03G 3/3052 |
| | | | | 455/207 |
| 4,386,357 A | * | 5/1983 | Patton | .................. H01Q 9/0442 |
| | | | | 343/700 MS |
| 7,129,899 B2 | * | 10/2006 | Jecko | ................... H01Q 9/0421 |
| | | | | 343/702 |

(Continued)

*Primary Examiner* — Dameon E Levi
*Assistant Examiner* — Jennifer F Hu
(74) *Attorney, Agent, or Firm* — Raymond Y. Chan; David and Raymond Patent Firm

(57) ABSTRACT

An anti-interference microwave antenna includes a reference ground and at least a radiating source spacedly disposed at the reference ground to define a radiating clearance between the radiating source and the reference ground, wherein the radiating source is electrically connected to the reference ground to ground the radiating source so as to narrow a bandwidth of the antenna. When a electromagnetic excitation signal is received at a feed point of the radiating source, the bandwidth of the antenna is narrowed down to prevent any interference of the electromagnetic wave signal received or generated by the antenna in response to nearby electromagnetic radiation frequency or stray radiation frequency of the adjacent frequency bands.

15 Claims, 9 Drawing Sheets

(56) References Cited

U.S. PATENT DOCUMENTS

| | | | |
|---|---|---|---|
| 2003/0146878 A1* | 8/2003 | Mikkola | H01Q 1/243 343/702 |
| 2004/0070539 A1* | 4/2004 | Shikata | H01Q 1/27 343/700 MS |
| 2005/0225484 A1* | 10/2005 | Kuramoto | H01Q 1/243 343/700 MS |
| 2009/0295645 A1* | 12/2009 | Campero | H01Q 1/38 343/700 MS |
| 2011/0309899 A1* | 12/2011 | Leiba | H01P 3/121 333/208 |
| 2012/0306698 A1* | 12/2012 | Warnick | H01Q 5/35 342/372 |
| 2014/0266959 A1* | 9/2014 | Xue | H01Q 1/48 343/848 |
| 2016/0111770 A1* | 4/2016 | Choi | H01Q 1/2216 343/841 |

* cited by examiner

ANTI-INTERFERENCE MICROWAVE ANTENNA

CROSS REFERENCE OF RELATED APPLICATION

This is a Continuation application that claims the benefit of priority under 35 U.S.C. § 120 to a non-provisional application, application Ser. No. 16/127,196, filed Sep. 10, 2018, which is Continuation application that claims the benefit of priority under 35 U.S.C. § 120 to a non-provisional application, application Ser. No. 16/035,689, filed Jul. 15, 2018, which is a non-provisional that claims which claims priority under 35 U.S.C. 119(a-d) to Chinese application number 201810595979.X, filed Jun. 11, 2018. The afore-mentioned patent applications are hereby incorporated by reference in their entireties.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to an antenna, and more particularly to an antenna with an anti-interference arrangement, wherein the anti-interference arrangement prevents electromagnetic wave signals received or generated by the antenna from being interfered by the nearby electromagnetic radiation frequency or the stray radiation frequency, so as to enhance the anti-interference ability of the antenna.

Description of Related Arts

Industrial Scientific and Medical (ISM) Bands are designated by ITU-R (ITU Radio-communication Sector) and are unlicensed radio bands reserved internationally for the use of radio frequency (RF) telecommunications by institutions such as industry, science, and medicine institutions. During the use of these bands, the transmission power thereof must be restricted (usually lower than 1W) and must not be interfere with other frequency bands. Nowadays, these ITU-R opened frequency bands being used for microwave detection are mainly set at 2.4 GHz, 5.8 GHz, 10.52 GHz, and 24.125 GHz. In recent years, new frequency bands are frequently utilized for the application of microwave detection. For example, the application of 5G technology will cause a new frequency band being used for microwave detection in addition to the existing frequency bands being already used for microwave detection. It is known that there will be a mutual interference when two or more frequency bands are used closely. For the microwave detection as an example, when the 5.8 GHz of frequency band is used for human or object motion detection, such 5.8 GHz of frequency band will be inevitably interfered by the application of 5G technology. As a result, the interference of the application of 5G technology will cause the inaccuracy of the detection result from the 5.8 GHz of frequency band. As the 5G technology is rapidly well-developed recently, the 5G system will be more open and the application thereof will be widely used. It can be foreseen that the large-scale application of 5G technology will inevitably form a high speed based on 5G data network and will continuously expand more frequency bands in the future. In other words, the possibility of interference of the frequency bands for the microwave detection will be highly increased by the application of 5G technology. Therefore, it is urgent to improve the antennas with anti-interfering ability for the microwave detection. Accordingly, a conventional method for enhancing the anti-interfering ability for the microwave detection antenna is the suppression method by shielding external wireless signals, signal filtering, and software algorithm processing to suppress the interference. However, such conventional method can only provide limited anti-interfering ability for limited frequency bands. Therefore, a need exists for an antenna that enhances the anti-interfering ability to different frequency bands. It is to the provision of such an antenna that the present disclosure is primarily directed.

SUMMARY OF THE PRESENT INVENTION

The invention is advantageous in that it provides an antenna with an anti-interference arrangement and method, wherein the anti-interference arrangement enhances the anti-interference ability of the antenna.

Another advantage of the invention is to an antenna with an anti-interference arrangement and method, wherein the anti-interference arrangement prevents electromagnetic wave signals received or generated by the antenna from being interfered by the nearby electromagnetic radiation frequency or the stray radiation frequency.

Another advantage of the invention is to an antenna with an anti-interference arrangement and method, wherein the impedance of the antenna is lowered to narrow the bandwidth thereof so as to prevent electromagnetic wave signals received or generated by the antenna from being interfered by the nearby electromagnetic radiation frequency or the stray radiation frequency.

Another advantage of the invention is to an antenna with an anti-interference arrangement and method, wherein the impedance of the antenna is lowered to enhance the radiating energy of the primary radiating wave within its radiating wave band, so as to reduce the harmonic radiation of the antenna.

Another advantage of the invention is to an antenna with an anti-interference arrangement and method, wherein the anti-interference circuit has a low impedance to match with the low impedance of the antenna in order to narrow the bandwidth of the antenna so as to prevent any interference of electromagnetic wave signals received or generated by the antenna of the present invention in response to the nearby electromagnetic radiation frequency.

Another advantage of the invention is to an antenna with an anti-interference arrangement and method, wherein the radiating source is grounded to reduce the impedance of the antenna.

Another advantage of the invention is to an antenna with an anti-interference arrangement and method, wherein the radiating source is electrically connected to the reference ground to ground the radiating source.

Another advantage of the invention is to an antenna with an anti-interference arrangement and method, wherein the anti-interference circuit provides a relatively large excitation current to the radiating source to ensure the stable operation of the antenna.

Another advantage of the invention is to an antenna with an anti-interference arrangement and method, wherein the radiating source has at least a radiating connection point electrically connected to the reference ground. A distance between the periphery of radiating source and the radiating connection point thereof is preset to generate an inductance therebetween under the excitation of the microwave excitation electrical signal.

Another advantage of the invention is to an antenna with an anti-interference arrangement and method, wherein a distance between the feed point and the radiating connection point 21 is greater than or equal to $\frac{1}{64}\lambda$, to generate an inductance therebetween under the excitation of the microwave excitation electrical signal.

Another advantage of the invention is to an antenna with an anti-interference arrangement and method, wherein by forming the radiating connection point of the radiating source at the physical center point thereof, the impedance of the antenna will be lowered under resonance state to enhance the anti-interference ability of the antenna.

Another advantage of the invention is to an antenna with an anti-interference arrangement and method, wherein the electrical connection element has two terminal ends electrically connecting with the radiating source and the reference ground respectively to reduce the internal impedance of the antenna under resonance state so as to enhance the anti-interference ability of the antenna.

Another advantage of the invention is to an antenna with an anti-interference arrangement and method, wherein the radiating connection point is overlapped with the feed point to electrically connect the feed point with the reference ground for reducing the internal impedance of the antenna under resonance state so as to enhance the anti-interference ability of the antenna.

Additional advantages and features of the invention will become apparent from the description which follows, and may be realized by means of the instrumentalities and combinations particular point out in the appended claims.

According to the present invention, the foregoing and other objects and advantages are attained by an antenna, comprising:

a reference ground; and at least a radiating source spacedly disposed at the reference ground to define a radiating clearance between the radiating source and the reference ground, wherein the radiating source is electrically connected to the reference ground to ground the radiating source so as to narrow a bandwidth of the antenna.

In accordance with another aspect of the invention, the present invention comprises a method of manufacturing an antenna which comprises at least a radiating source and a reference ground, comprising the following steps.

(A) Spacedly dispose the radiating source at the reference ground to define a radiation clearance between the radiating source and the reference ground.

(B) Electrically connect the radiating source to the reference ground to ground the radiating source so as to narrow a bandwidth of the antenna.

In accordance with another aspect of the invention, the present invention comprises a method of enhancing an anti-interference ability of an antenna which comprises at least a radiating source and a reference ground, comprising the following steps.

(1) Form a radiating clearance between the radiating source and the reference ground.

(2) Ground the radiating source by electrically connecting the radiating source to the reference ground to reduce an internal impedance of the antenna, such that when a electromagnetic excitation signal is received at a feed point of the radiating source, a bandwidth of the antenna is narrowed down to prevent any interference of the electromagnetic wave signal received or generated by the antenna in response to nearby electromagnetic radiation frequency or stray radiation frequency of the adjacent frequency bands.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

It is appreciated that the terms "longitudinal", "transverse", "upper", "lower", "front", "rear", "left", "right", "vertical", "horizontal", "top", "bottom", "exterior", and "interior" in the following description refer to the orientation or positioning relationship in the accompanying drawings for easy understanding of the present invention without limiting the actual location or orientation of the present invention. Therefore, the above terms should not be an actual location limitation of the elements of the present invention.

It is appreciated that the terms "one", "a", and "an" in the following description refer to "at least one" or "one or more" in the embodiment. In particular, the term "a" in one embodiment may refer to "one" while in another embodiment may refer to "more than one". Therefore, the above terms should not be an actual numerical limitation of the elements of the present invention.

Figure 1:
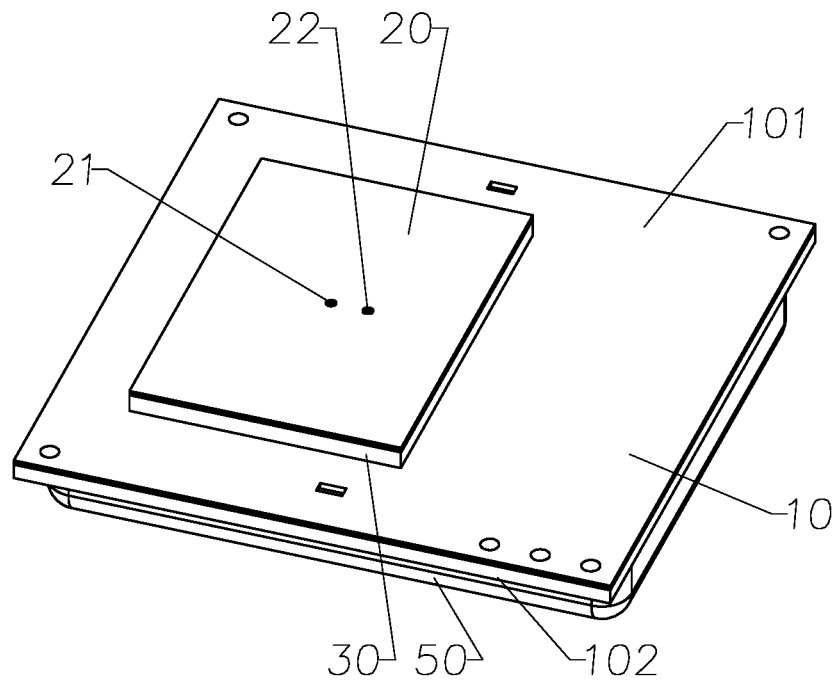
FIG. 1 is a perspective view of an antenna with an anti-interference arrangement according to a first preferred embodiment of the present invention.
Figure 2:
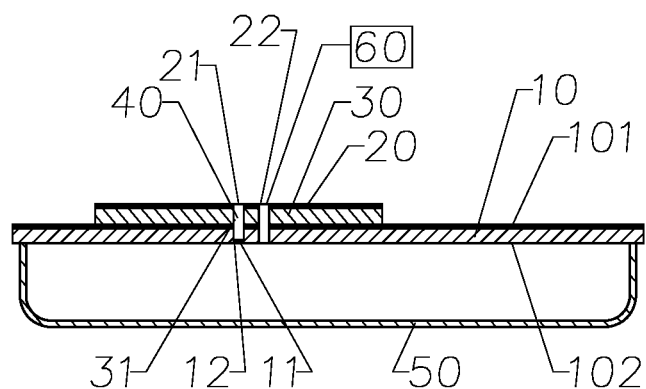
FIG. 2 is a sectional view of the antenna according to the above first preferred embodiment of the present invention.

Referring to FIGS. 1 and 2 of the drawings, an antenna according to a preferred embodiment of the present invention is illustrated, wherein the antenna comprises a reference ground 10 and at least a radiating source 20 spacedly disposed at the reference ground 10 on a first side 101 thereof to form an antenna body. Accordingly, the antenna further comprises an oscillating circuit electrically coupled to the antenna body.

It is worth mentioning that the radiating source 20 of the present invention is spaced apart from the reference ground 10 that there is not direct contact between the reference ground 10 and the radiating source 20. In particular, a space is formed between the reference ground 10 and the radiating source 20 as a radiating clearance 30 therebetween.

Figure 7A:
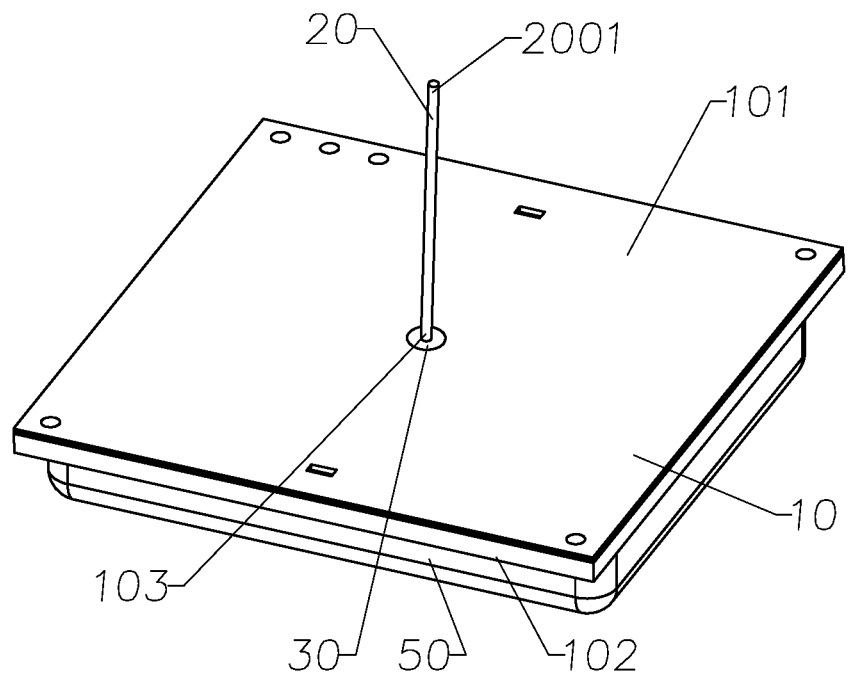
FIG. 7A illustrates a fourth alternative mode of the antenna according to the above first preferred embodiment of the present invention.
Figure 7B:
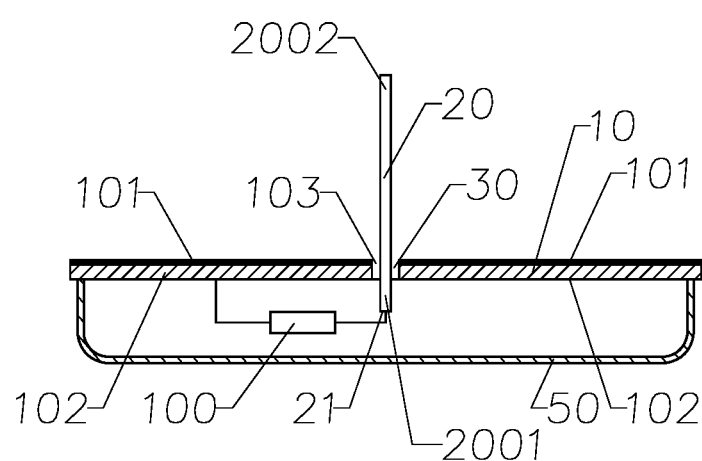
FIG. 7B is a sectional view of the fourth alternative mode of the antenna according to the above first preferred embodiment of the present invention.

Furthermore, the radiating clearance 30 defined between the reference ground 10 and the radiating source 20 refers a surface difference between a surface of the reference ground 10 and a surface of the radiating source 20. In one embodiment, the radiating clearance 30 defined between the reference ground 10 and the radiating source 20 is a height difference between the first side 101 of the reference ground 10 and an outer surface of the radiating source 20, as shown in FIGS. 1 and 2. In another embodiment, the radiating clearance 30 defined between the reference ground 10 and the radiating source 20 is a gap between the first side 101 of the reference ground 10 and a circumferential surface of the radiating source 20, as shown in FIGS. 7A and 7B. Therefore, the formation of the radiating clearance 30 between the reference ground 10 and the radiating source 20 should not be limited by only two designated surfaces thereof.

As shown in FIGS. 1 and 2, the radiating source 20 is electrically connected to the reference ground 10, wherein the radiating source 20 is grounded. It is worth mentioning that the configuration of the conventional antenna is that the radiating source is not grounded and is not electrically connected to the reference ground. By grounding the radiating source 20, an impedance of the antenna of the present invention can be substantially reduced to narrow down a bandwidth of the antenna, so as to avoid any interference of electromagnetic wave signals received or generated by the antenna of the present invention by electromagnetic radiation frequency or stray radiation frequency of the adjacent frequency bands.

As shown in FIGS. 1 and 2, the radiating source 20 has at least a radiating connection point 21 and a feed point 22. The reference ground 10 further has at least a reference ground connection point 11. The radiating connection point 21 of the radiating source 20 is electrically connected to the reference ground connection point 11 of the reference ground 10, such that the radiating source 20 is grounded. In addition, the feed point 22 of the radiating source 20 is arranged to be connected to an excitation current. Accordingly, the oscillating circuit is connected to the feed point 22 of the antenna body to generate the electromagnetic wave signal (microwave excitation electrical signal). Once the excitation current is received by the feed point 22 of the radiating source 20, the antenna will initialize at a polarization direction that the radiating source 20 will generate radiate energy at a radial and outward direction. As it is mentioned, the radiating source 20 is electrically connected to the reference ground 10 to ground the radiating source 20. Once the excitation current is received by the feed point 22 of the radiating source 20, a predetermined impedance is generated between the radiating connection point 21 and the feed point 22 of the radiating source due to the inductance characteristics therebetween. As a result, the antenna will be excited and initialized at a polarization direction to generate radiate energy at the radiating source 20 at a radial and outward direction. At the same time, the impedance will be lowered between the radiating connection point 21 and the feed point 22 of the radiating source due to the inductance characteristics therebetween, so as to narrow down the bandwidth of the antenna. By narrowing the bandwidth of the antenna, any interference of electromagnetic wave signals received or generated by the antenna of the present invention will be substantially reduce in response to the electromagnetic radiation frequency or stray radiation frequency of the adjacent frequency bands. It is worth mentioning that the feed point 22 of the radiating source 20 must be deviated from a physical center point thereof, so that it is easily excited by the excitation current. In addition, there must be an impedance between the radiating source 20 and the reference ground 10 in order to excite the radiating source 20. Even though the radiating connection point 21 of the radiating source 20 is grounded, the impedance will be generated between the radiating connection point 21 and the feed point 22 in response to the inductance characteristics therebetween under the high frequency excitation signal. It is worth mentioning that even the impedance is generated, such impedance is relatively low.

It is worth mentioning that the impedance of the antenna is lowered to enhance the radiating energy of the primary radiating wave within its radiating wave band, so as to reduce the harmonic radiation of the antenna. Accordingly, the antenna not only generates the electromagnetic waves in its radiation frequency band but also generates harmonic wave at frequency multiplication of its radiation frequency band, which is stray radiation.

Preferably, a distance between the radiating connection point 21 and the feed point 22 of the radiating source 20 is greater than or equal to $\frac{1}{64}\lambda$, where $\lambda$ is the wavelength of the electromagnetic wave signal received or generated by the antenna. Under the excitation of the excitation electrical signal, the electromagnetic wave signal will generate the inductance characteristics between the radiating connection point 21 and the feed point 22 of the radiating source 20. Since the feed point 22 of the radiating source 20 is deviated from the physical center point thereof, the intensity required for the excitation current of the antenna to the electromagnetic wave signal will be substantially reduced. As a result, once the excitation current is received by the feed point 22 of the radiating source 20, the antenna is easily initialized at a polarization direction.

As shown in FIGS. 1 and 2, the radiating connection point 21 of the radiating source 20 is preferably defined as the physical center point thereof. In other words, the physical center point of the radiating source 20 is electrically connected to the reference ground 10 to ground the radiating source 20. Therefore, by forming the radiating connection point 21 of the radiating source 20 at the physical center point thereof, the antenna can evenly and stably generate the radiate energy via the radiating source 20 in a radial and outward direction after the initial polarization direction is generated. It should be understood by a person who skilled in the art that the inductance is generated between the periphery of the radiating source 20 and the feed point 22 thereof under the excitation of the excitation current, and the resonant circuit of the antenna with a distributed capacitance is generated between the radiating source 20 and the reference ground 10 for receiving or generating the electromagnetic wave signal.

Figure 3:
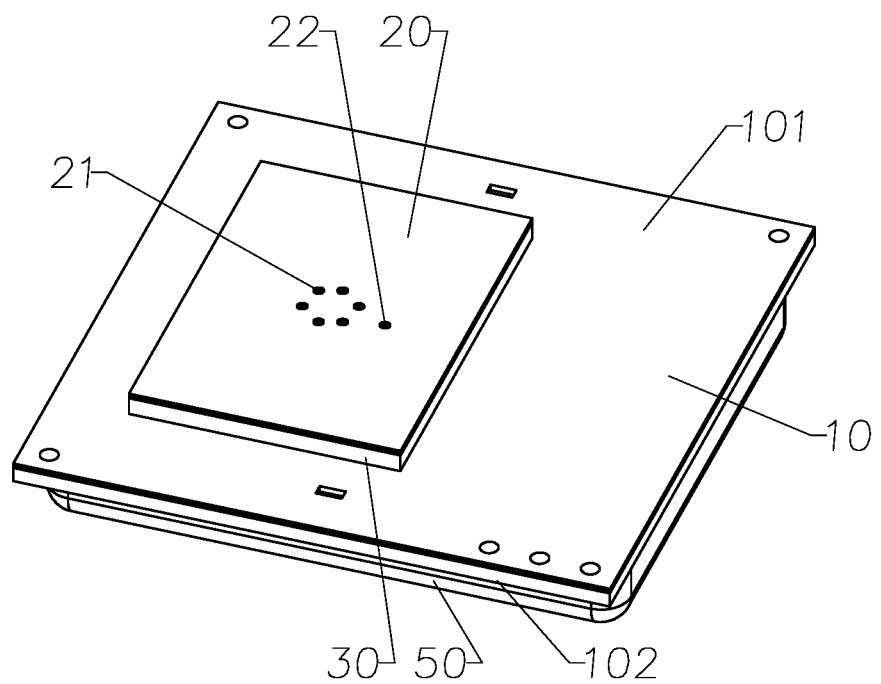
FIG. 3 illustrates a first alternative mode of the antenna according to the above first preferred embodiment of the present invention.

As shown in FIGS. 1 and 2, there is one radiating connection point 21 of the radiating source 20. In another embodiment as shown in FIG. 3, there are two or more radiating connection points 21 of the radiating source 20, wherein the physical center point of the radiating source 20 is surrounded by the radiating connection points 21 of the radiating source 20. In addition, a distance between the periphery of radiating source 20 and the radiating connection points 21 thereof is preset. Under the excitation of the electromagnetic wave signal, the inductance characteristics will be generated between the radiating connection point 21 and the feed point 22 of the radiating source 20. Then, when the excitation current is received by the feed point 22 of the radiating source 20, the impedance of the antenna is lowered to narrow down the bandwidth thereof. In addition, a distance between the feed point 22 and any one of the radiating connection points 21 is greater than or equal to $\frac{1}{64}\lambda$, as shown in FIG. 3.

As shown in FIGS. 1 and 2, the antenna further comprises an electrical connection element 40 having two terminal ends electrically connecting with the radiating connection point 21 of the radiating source 20 and the reference ground connection point 11 of the reference ground 10 respectively. Therefore, the electrical connection element 40 forms an electrical connection media to electrically connect the radiating source 20 and the reference ground 10 with each other so as to ground the radiating source 20.

As shown in FIGS. 1 and 2, the radiating connection point 21 of the radiating source 20 is preferably aligned with the reference ground connection point 11 of the reference ground 10. In other words, the extension direction between the radiating connection point 21 of the radiating source 20 and the reference ground connection point 11 of the reference ground 10 is perpendicular to the first side of reference ground 10.

It is worth mentioning that the electrical connection element 40 is preferably coupled between the radiating source 20 and the reference ground 10, such that the terminal ends of the electrical connection element 40 can be electrically connected to the radiating connection point 21 of the radiating source 20 and the reference ground connection point 11 of the reference ground 10 respectively, so as to electrically connect the radiating source 20 with the reference ground 10. According to the preferred embodiment as one of the examples, the radiating source 20 is initially retained adjacent to the first side 101 of the reference ground 10 to form the radiating clearance 30 between the reference ground 10 and the radiating source 20. Then, a reference ground slot 12 is formed at an opposed second side 102 of the reference ground 10, wherein the reference ground slot 12 is extended corresponding to the radiating source 20. It should be understood that the radiating clearance 30 between the radiating source 20 and the reference ground 10 is a solid media, as shown in FIGS. 1 and 2. In other words, at the same time when the reference ground slot 12 is formed, a clearance slit 31 is also formed within the radiating clearance 30, wherein the reference ground slot 12 of the reference ground 10 is communicated with and extended through the clearance slit 31 of the radiating clearance 30. The radiating connection point 21 of the radiating source 20 is set corresponding to the reference ground slot 12 of the reference ground 10 and the clearance slit 31 of the radiating clearance 30. Next, a molding element is sequentially extended to the reference ground slot 12 of the reference ground 10 and the clearance slit 31 of the radiating clearance 30 in order to connect the molding element to the radiating connection point 21 of the radiating source 20 and to connect the molding element to the reference ground 10. Therefore, the molding element is configured as the electrical connection element 40 to electrically connect the radiating source 20 and the reference ground 10 with each other. In addition, the connection point between the molding element and the reference ground 10 becomes the reference ground connection point 11 thereof.

It is worth mentioning that the molding element can be, but not limited to, a gold wire, silver wire or other conducive wires according to the preferred embodiment. When the molding element is used as the connection wire, the connection wire is extended from the reference ground slot 12 of the reference ground 10 and the clearance slit 31 of the radiating clearance 30 to the radiating connection point 21 of the radiating source 20 and to connect to the reference ground 10, so as to form the electrical connection element 40 to electrically connect the radiating source 20 and the reference ground 10 with each other. Alternatively, one end of the connection wire is initially connected to the radiating connection point 21 of the radiating source 20. Then, the radiating source 20 is retained close to the first side 101 of the reference ground 10, wherein the connection wire is extended through the reference ground slot 12 of the reference ground 10 to connect with the reference ground 10, so as to form the electrical connection element 40 to electrically connect the radiating source 20 and the reference ground 10 with each other. In one embodiment, the molding element can be, but not limit to, fluid material, wherein the molding element is filled into the reference ground slot 12 of the reference ground 10 and the clearance slit 31 of the radiating clearance 30. Once the molding element is solidified, the molding element forms the electrical connection element 40 to electrically connect the radiating source 20 and the reference ground 10 with each other.

As shown in FIGS. 1 and 2, the antenna further comprises a shield member 50 coupled at the reference ground 10 at the second side 102 thereof.

Figure 4:
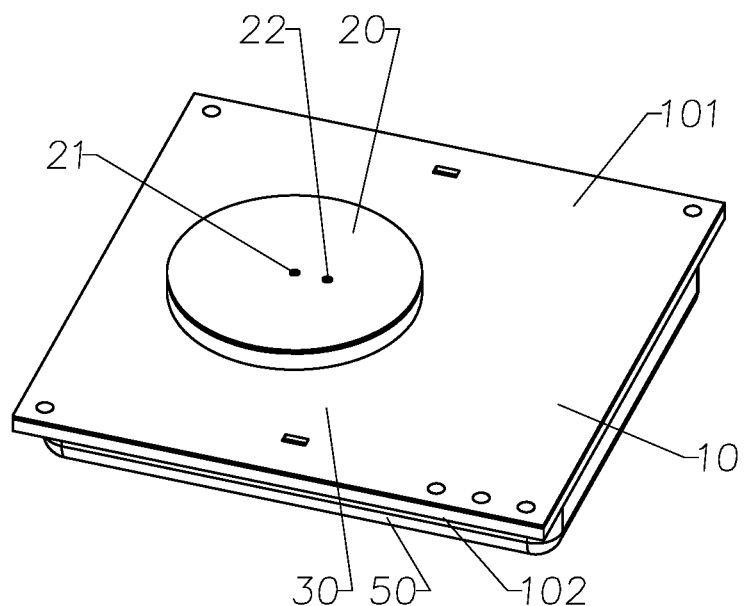
FIG. 4 illustrates a second alternative mode of the antenna according to the above first preferred embodiment of the present invention.
Figure 5:
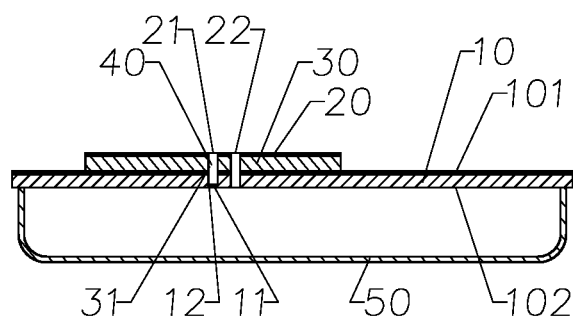
FIG. 5 is a sectional view of the second alternative mode of the antenna according to the above first preferred embodiment of the present invention.
Figure 6:
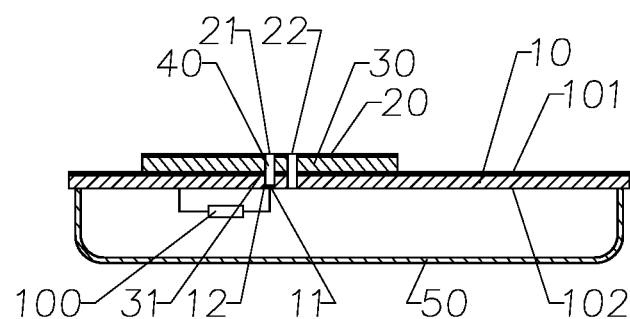
FIG. 6 illustrates a third alternative mode of the antenna according to the above first preferred embodiment of the present invention.

Accordingly, the shape of the radiating source 20 of the antenna should not be limited. For example, the radiating source 20 can be configured to have a rectangular shape as shown in FIGS. 1 to 3. It could be configured to have a square shape as well. Likewise, the radiating source 20 can be configured to have a circular shape or oval shape as shown in FIGS. 4 and 5. In other word, the extension direction of the radiating source 20 is the same as that of the reference ground 10, i.e. the radiating source 20 is parallel to the reference ground 10, to form a flat panel antenna. In other embodiment as shown in FIGS. 7A and 7B, the extension direction of the radiating source 20 is the perpendicular to that of the reference ground 10, i.e. the radiating source 20 is perpendicular to the reference ground 10, to form a column type antenna. As shown in FIGS. 7A and 7B, the antenna further comprises at least a supplement inductor 100, wherein one end of the supplement inductor 100 is electrically connected to the radiating connection point 21 of the radiating source 20 while another end of the supplement inductor 100 is grounded. As shown in FIG. 6, the radiating source 20 is formed as part of the flat panel antenna with the supplement inductor 100, wherein one end of the supplement inductor 100 is electrically connected to the radiating connection point 21 of the radiating source 20 while another end of the supplement inductor 100 is grounded.

Figure 8:
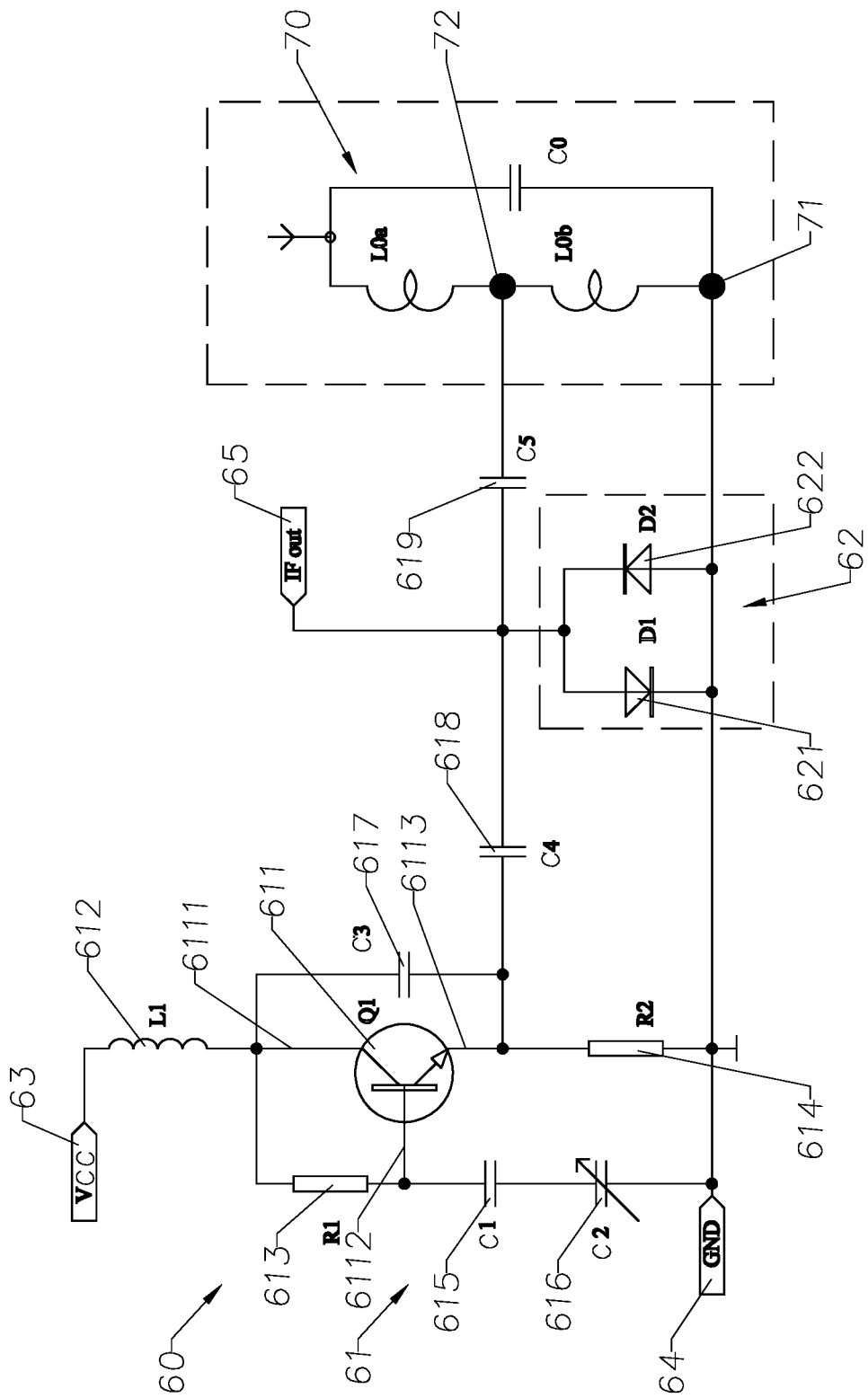
FIG. 8 is an anti-interference circuit diagram of the antenna according to the above first preferred embodiment of the present invention.

As shown in FIG. 8, the antenna further comprises an anti-interference circuit 60 electrically connected to the feed point 22 of the radiating source 20 to enable the excitation current passing through the anti-interference circuit 60 to the feed point 22 of the radiating source 20. The anti-interference circuit 60 has a low impedance to provide the excitation current to match with the low impedance of the antenna so as to enable the antenna generating the initial polarization direction. As a result, the impedance of the antenna will be reduced and the bandwidth of the antenna will be narrowed down such that any interference of electromagnetic wave signals received or generated by the antenna of the present invention will be substantially reduced in response to the nearby electromagnetic radiation frequency or stray radiation frequency of the adjacent frequency bands.

As shown in FIG. 8, the antenna further comprises an analog circuit 70 electrically connected with the radiating source 20 and the reference ground 10 for being excited by the excitation current. As shown in FIG. 8, the analog circuit 70 comprises a first analog point 71 analogously representing to the radiating connection point 21 of the radiating source 20 and a second analog point 72 analogously representing to the feed point 22 of the radiating source 20. It is worth mentioning that the antenna body is excited by the excitation current from the oscillating circuit, it performs as the analog circuit 70 to be excited.

In particular, the anti-interference circuit 60 comprises an oscillation circuit module 61 (i.e. the oscillating circuit) and a mixing detection circuit module 62 electrically connected to the oscillation circuit module 61. Accordingly, the second analog point 72 of the analog circuit 70 is electrically connected to the oscillation circuit module 61 of the anti-interference circuit 60. The mixing detection circuit module 62 is located and retained between the oscillation circuit module 61 and the radiating source 20. The mixing detection circuit module 62 adapts the low-impedance output of the oscillation circuit module 61 and the low impedance of the antenna to be grounded, so as to ensure the stability and reliability of the operation of the antenna. In other words, the feed point 22 f the radiating source 20 is electrically connected to the oscillation circuit module 61 of the anti-interference circuit 60.

Accordingly, once the impedance of the antenna is lowered, its bandwidth will be narrowed to enhance the anti-interference ability. The impedance of the existing antenna can be configured as low as 50 ohms. However, the impedance of the existing antenna cannot be further lowered below 50 ohms because of the conventional oscillating circuit. On the other hand, the oscillation circuit module 61 of the present invention is configured to match with the low impedance antenna in order to further reduce the impedance of the antenna. In other words, the strength of the excitation current for the low impedance antenna will be greater. However, under the emission power regulation of the antenna, the conventional oscillating circuit cannot provide such great excitation current. Therefore, the oscillation circuit module 61 of the present invention must have a low impedance to match with the low impedance antenna.

Accordingly, the anti-interference circuit 60 can be set in the reference ground 10. For example, the anti-interference circuit 60 can be printed or coated on the reference ground 10 or can be etched on the reference ground 10. In other words, the method of forming the anti-interference circuit 60 on the reference ground 10 should not be limited in the present invention.

Preferably, the connection between the oscillation circuit module 61 and the mixing detection circuit module 62 of the anti-interference circuit 60, and the connection between the mixing detection circuit module 62 and the feed point 22 of the radiating source 20 can be the capacitive coupling connections. So, the mixing detection circuit module 62 adapts the low-impedance output of the oscillation circuit module 61 and the low impedance of the antenna to be grounded, to effectively suppress the differential interference from coupling and the common interference from the reception of the antenna, so as to enhance the anti-interference ability of the antenna. It is worth mentioning that the antenna is used for human body movement detection. Due to the Doppler effect, there will be a difference in the wavelengths between the received and transmitted electromagnetic waves. Therefore, it is necessary to distinguish the received and transmitted electromagnetic waves by the mixing detection circuit module 62 to obtain a differential value for the calculation of the related movement data. In other words, the mixing detection circuit module 62 can be disabled when the antenna is used for data transmission.

As shown in FIG. 8, the anti-interference circuit 60 has a low impedance and a relatively large excitation current, that matches with the low impedance of the antenna, to the feed point 22 of the radiating source 20. In particular, the oscillation circuit module 61 of the anti-interference circuit 60 comprises a triode circuit processor 611, an inductor 612, a first resistor 613, a second resistor 614, a first capacitor 615, a second capacitor 616, a third capacitor 617, a fourth capacitor 618 and a fifth capacitor 619. The triode circuit processor 611 comprises a first connection terminal 6111, a second connection terminal 6112, and a third connection terminal 6113. One end of the inductor 612 is electrically connected to a power source VCC 63 while another end of the inductor 612 is electrically connected to the first connection terminal 6111 of the triode circuit processor 611. In other words, the first connection terminal 6111 of the triode circuit processor 611 is electrically connected to a power source VCC 63 through the inductor 612. One end of the first resistor 613 is electrically connected to the first connection terminal 6111 of the triode circuit processor 611 while another end of the first resistor 613 is electrically connected to the second connection terminal 6112 of the triode circuit processor 611. One end of the first capacitor 615 is electrically connected to the second connection terminal 6112 of the triode circuit processor 611 while another end of the first capacitor 615 is electrically connected to one end of the second capacitor 616. Another end of the second capacitor 616 is electrically connected to a ground point 64, such that the second connection terminal 6112 is grounded. In other words, the second connection terminal 6112 of the triode circuit processor 611 is grounded. One end of the third capacitor 617 is electrically connected to the first connection terminal 6111 of the triode circuit processor 611 while another end of the third capacitor 617 is electrically connected to the third connection terminal 6113 of the triode circuit processor 611. One end of the second resistor 614 is electrically connected to the third connection terminal 6113 of the triode circuit processor 611 while another end of the second resistor 614 is electrically connected to the ground point 64. One end of the fourth capacitor 618 is electrically connected to the third connection terminal 6113 of the triode circuit processor 611 while another end of the fourth capacitor 618 is electrically connected to one end of the fifth capacitor 619. Another end of the fifth capacitor 619 is electrically connected to the feed point 22 of the radiating source 20. In other words, the feed point 22 of the radiating source 20 is directly and electrically connected to the third connection terminal 6113 of the triode circuit processor 611. Accordingly, when the reference ground 10 is grounded (i.e. the oscillation circuit module 61 has the zero reference potential), and when the feed point 22 is electrically connected to the oscillation circuit module 61, the antenna body can receive the excitation current to generate the electromagnetic wave signal.

Accordingly, comparing with the conventional oscillation circuit, the first terminal of the triode circuit provides the excitation electrical signal to the feed point 22 of the radiating source 20. As the current is weak, it is difficult to match with the low impendence of the antenna, so that the conventional antenna cannot be excited. It is worth mentioning that the triode circuit processor 611 of the present invention can be a MOS transistor, wherein the third connection terminal 6113 of the triode circuit processor 611 can be the electrode source of the MOS transistor. In other words, the feed point 22 of the radiating source 20 is directly and electrically connected to the electrode source of the MOS transistor. Therefore, the anti-interference circuit 60 can provide a relatively large excitation current to the feed point 22 of the radiating source 20 and to lower the low impedance of the antenna. In another embodiment, the triode circuit processor 611 can be a triode, wherein the third connection terminal 6113 of the triode circuit processor 611 can be the emitter of the triode. In other words, the feed point 22 of the radiating source 20 is directly and electrically connected to the emitter of the triode. Therefore, the anti-interference circuit 60 can provide a relatively large excitation current to the feed point 22 of the radiating source 20 and to lower the low impedance of the antenna.

It should be understood that the present invention provides the excitation current to the radiating source 20 through the third connection terminal 6113 of the triode circuit processor 611. The third connection terminal 6113 of the triode circuit processor 611 is the output terminal thereof. In other words, the current is output at the third connection terminal 6113 of the triode circuit processor 611 to lower the impedance of the oscillation circuit module 61, so as to provide a relatively large excitation current to the feed point 22 of the radiating source 20 and to lower the low impedance of the antenna. Accordingly, the configuration of the anti-interference circuit 60 should not be limited in the present invention.

The mixing detection circuit module 62 comprises a first diode 621 and a second diode 622, wherein one end of the first diode 621 and one end of the second diode 622 are connected to a signal output terminal 65. Another end of the first diode 621 and another end of the second diode 622 are connected to the ground point 64.

Accordingly, the connection among the anti-interference circuit 60, the radiating source 20, and the reference ground 10 prevents any mutual affect among the direct current potentials of the oscillation circuit module 61 of the anti-interference circuit 60, the mixing detection circuit module 62 of the anti-interference circuit 60, and the analog circuit 70, so as to ensure the stability and reliability of the antenna. Thus, by configuring the anti-interference circuit 60 to configure the fifth capacitor 619 between the third capacitor 617 and the fourth capacitor 618 of the oscillation circuit module 61 and the feed point 22 of the radiating source 20, the oscillation circuit module 61, the mixing detection circuit module 62, and the feed point 22 of the radiating source 20 can be capacitive coupling with each other. Therefore, the mixing detection circuit module 62 adapts the low impedance output of the oscillation circuit module 61 and the low impedance of the antenna with respect to the ground, so as to effective suppress the differential interference from the coupling and the common interference from the reception of the antenna. In other words, the anti-interference ability of the antenna will be enhanced.

In addition, according to the antenna of the present invention, the inductor 612 is provided between the first connection terminal 6111 of the triode circuit processor 611 and the power source VCC 63 to further reduce the interference of the oscillation circuit module 61, so as to provide the suitable excitation current to match with the low impedance antenna.

According to the preferred embodiment, the radiating connection point 21 of the radiating source 20 is electrically connected to the reference ground connection point 11 of the reference ground 10 to electrically ground the radiating connection point 21 of the radiating source 20 at the ground point 64. Through such connection, after the excitation current is received at the feed point 22 of the radiating source 20, the inductance characteristics will be generated between the radiating connection point 21 and the feed point 22 of the radiating source 20 to provide a predetermined impedance, such that the antenna is easily initialized at a polarization direction to stably generate the radiate energy in a radial and outward direction. At the same time, the inductance characteristics will be generated between the radiating connection point 21 and the feed point 22 to have a relatively low impedance. Therefore, the bandwidth of the antenna will be narrowed down to prevent the electromagnetic wave signals received or generated by the antenna from being interfered by the nearby electromagnetic radiation frequency or the stray radiation frequency, so as to enhance the anti-interference ability of the antenna.

In other words, when the impedance of the antenna body is reduced, the corresponding bandwidth thereof will be narrowed, such that the frequency of the electromagnetic wave signal generated by the antenna body will be more concentrated within the bandwidth. As a result, the electromagnetic wave signal by the antenna body will prevent being interfered by the nearby electromagnetic radiation frequency or the stray radiation frequency, so as to enhance the anti-interference ability of the antenna. It is worth mentioning that when the impedance of the antenna body is reduced, the amount of the excitation current will be relatively increased. The impedance of the oscillation circuit module 61 will be further reduced to provide the excitation current to the antenna body.

Therefore, by grounding the radiating source 20 and by configuring the distance between the radiating connection point 21 and the feed point 22 of the radiating source 20 being greater than or equal to $\frac{1}{64}\lambda$, the portion between the feed point 22 of the radiating source 20 and the reference ground connection point 11 will be inducted under high frequency excitation current, i.e. the element L0b of the analog circuit 70. As a result, the impedance of the antenna body is reduced when the antenna body is excited by the excitation current to generate the electromagnetic wave signal, especially when the reference ground connection point 11 is provided at the physical center point of the radiating source 20.

It is worth mentioning that an inductor can be provided for the antenna body, wherein one end of the inductor is connected to the reference ground connection point 11 and another end of the inductor is grounded. Therefore, the distance between the radiating connection point 21 and the feed point 22 of the radiating source 20 will not be limited. Since the reference ground 10 is grounded, the ground end of the inductor can be grounded by connecting to the reference ground 10.

Figure 9:
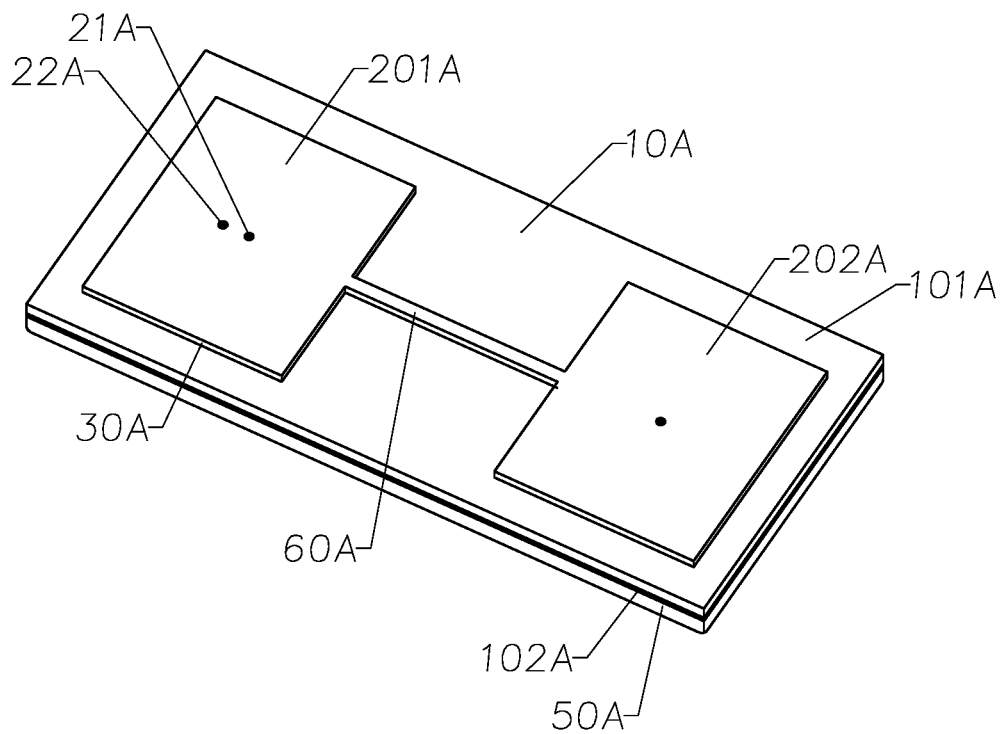
FIG. 9 is a perspective view of an antenna with an anti-interference arrangement according to a second preferred embodiment of the present invention.
Figure 10:
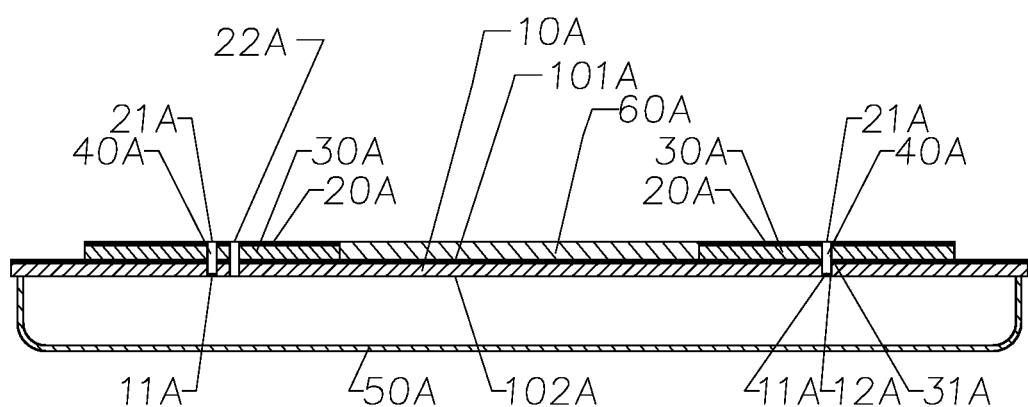
FIG. 10 is a sectional view of the antenna according to the above second preferred embodiment of the present invention.

FIGS. 9 and 10 illustrate a second embodiment of the present invention as an alternative mode thereof, wherein the antenna comprises a reference ground 10A, two radiating sources 20A, and an elongated connector 60A. The two radiating sources 20A are located adjacent to each other and are electrically connected by the elongated connector 60A. The elongated connector 60A is embodied as a micro-connection strip. A radiating clearance 30A is formed at each of the radiating sources 20A and the reference ground 10A.

Accordingly, the reference ground 10A has a first side 101A and an opposed second side 102A, wherein the radiating sources 20A are provided at the first side 101A of the reference ground 10A.

As shown in FIGS. 9 and 10, each of the radiating sources 20A has at least a radiating connection point 21A. The reference ground 10A has at least two reference ground connection points 11A. The radiating connection points 21A of the radiating sources 20A are electrically connected to the reference ground connection points 11A of the reference ground 10A respectively. One of the radiating sources 20A has a feed point 22A while another radiating source 20A does not contain any feed point. For easy understanding, the radiating source 20A with the feed point 22A becomes a primary radiating source 201A and the radiating source 20A without the feed point 22A becomes a secondary radiating source 202A as shown in FIGS. 9 and 10. In other words, the primary radiating source 201A and the secondary radiating source 202A are located adjacent to each other. The radiating clearance 30A is formed between the reference ground 10A and each of the primary radiating source 201A and the secondary radiating source 202A. Two ends of the elongated connector 60A are electrically connected to the primary radiating source 201A and the secondary radiating source 202A respectively.

The excitation current is received at the feed point 22A of the primary radiating source 201A. After the excitation current is received at the feed point 22A of the primary radiating source 201A, the excitation current passes through the elongated connector 60A to the secondary radiating source 202A. At this time, the antenna is initialized at a polarization direction to stably generate the radiate energy in a radial and outward direction through the radiating clearance 30A. Since the primary radiating source 201A and the secondary radiating source 202A are electrically connected with the reference ground 10A, the inductance characteristics will be generated between the radiating connection point 21 and the feed point 22 to provide a predetermined impedance after the excitation current is received at the feed point 22A of the primary radiating source 201A and is sent to the secondary radiating source 202A through the elongated connector 60A. Therefore, the bandwidth of the antenna will be narrowed down to prevent the electromagnetic wave signals received or generated by the antenna from being interfered by the nearby electromagnetic radiation frequency or the stray radiation frequency, so as to enhance the anti-interference ability of the antenna.

Preferably, a distance between the feed point 22A and the radiating connection point 21A of the primary radiating source 201A is greater than or equal to $\frac{1}{64}\lambda$, where $\lambda$ is the wavelength of the electromagnetic wave signal received or generated by the antenna. Under the excitation of the electromagnetic wave signal, the electromagnetic wave signal will generate the inductance characteristics between the feed point 22A and the radiating connection point 21A of the primary radiating source 201A. Since the feed point 22A of the primary radiating source 201A is deviated from the physical center point thereof, the intensity required for the excitation current of the antenna to the electromagnetic wave signal will be substantially reduced. As a result, once the excitation current is received by the feed point 22A of the primary radiating source 201A, the antenna is easily initialized at a polarization direction.

Preferably, the radiating connection point 21A of the primary radiating source 201A is defined as the physical center point thereof. In other words, the physical center point of the primary radiating source 201A is electrically connected to the reference ground 10A to ground the primary radiating source 201A. Therefore, a distance between the periphery of primary radiating source 201A and the radiating connection point 21A thereof is preset. Correspondingly, the radiating connection point 21A of the secondary radiating source 202A is defined as the physical center point thereof, wherein the physical center point of the secondary radiating source 202A is electrically connected to the reference ground 10A, such that a distance between the periphery of secondary radiating source 202A and the radiating connection point 21A thereof is preset. Therefore, the antenna can evenly and stably generate the radiate energy via the primary radiating source 201A and the secondary radiating source 202A in a radial and outward direction after the initial polarization direction is generated. Under the excitation of the electromagnetic wave signal and through the electrical connection among the reference ground 10A and the physical center points of the primary radiating source 201A and the secondary radiating source 202A, when the excitation current is received by the feed point 22A of the primary radiating source 201A to the secondary radiating source 202A through the elongated connector 60A, the antenna can evenly and stably generate the radiate energy via the primary radiating source 201A and the secondary radiating source 202A in a radial and outward direction. At the same time, the inductance characteristics will be generated between the feed point 22A and the radiating connection point 21A of the primary radiating source 201A and the inductance characteristics will be generated between the elongated connector 60A and the radiating connection point 21A of the secondary radiating source 202A to lower the impedance of the antenna. Therefore, the bandwidth of the antenna will be narrowed down to prevent the electromagnetic wave signals received or generated by the antenna from being interfered by the nearby electromagnetic radiation frequency or the stray radiation frequency, so as to enhance the anti-interference ability of the antenna.

As shown in FIGS. 9 and 10, the antenna further comprises at least two electrical connection elements 40A, wherein one of the electrical connection elements 40A has two terminal ends electrically connecting with the radiating connection point 21A of the primary radiating source 201A and one of the reference ground connection points 11A of the reference ground 10A respectively. Therefore, the electrical connection element 40A forms an electrical connection media to electrically connect the primary radiating source 201A and the reference ground 10A with each other so as to ground the primary radiating source 201A. Another electrical connection element 40A has two terminal ends electrically connecting with the radiating connection point 21A of the secondary radiating source 202A and another reference ground connection point 11A of the reference ground 10A respectively. Therefore, the electrical connection element 40A forms an electrical connection media to electrically connect the secondary radiating source 202A and the reference ground 10A with each other so as to ground the secondary radiating source 202A.

Preferably, there are at least two radiating connection points 21A provided by at least one of the primary radiating source 201A and the secondary radiating source 202A. In one embodiment, for example, the primary radiating source 201A provides two or more radiating connection points 21A while the secondary radiating source 202A provides one radiating connection point 21A. The physical center point of the primary radiating source 201A is surrounded by the radiating connection points 21A of the primary radiating source 201A. The radiating connection point 21A of the secondary radiating source 202A is the physical center point thereof. In another embodiment, the primary radiating source 201A provides one radiating connection point 21A while the secondary radiating source 202A provides two or more radiating connection point 21A. The radiating connection point 21A of the primary radiating source 201A is the physical center point thereof. The physical center point of the secondary radiating source 202A is surrounded by the radiating connection points 21A of the secondary radiating source 202A. In another further embodiment, the primary radiating source 201A provides two or more radiating connection points 21A while the secondary radiating source 202A provides two or more radiating connection point 21A. The physical center point of the primary radiating source 201A is surrounded by the radiating connection points 21A of the primary radiating source 201A. The physical center point of the secondary radiating source 202A is surrounded by the radiating connection points 21A of the secondary radiating source 202A.

As shown in FIGS. 9 and 10, the antenna further comprises a shield member 50A coupled at the reference ground 10A at the second side 102A thereof.

Figure 11:
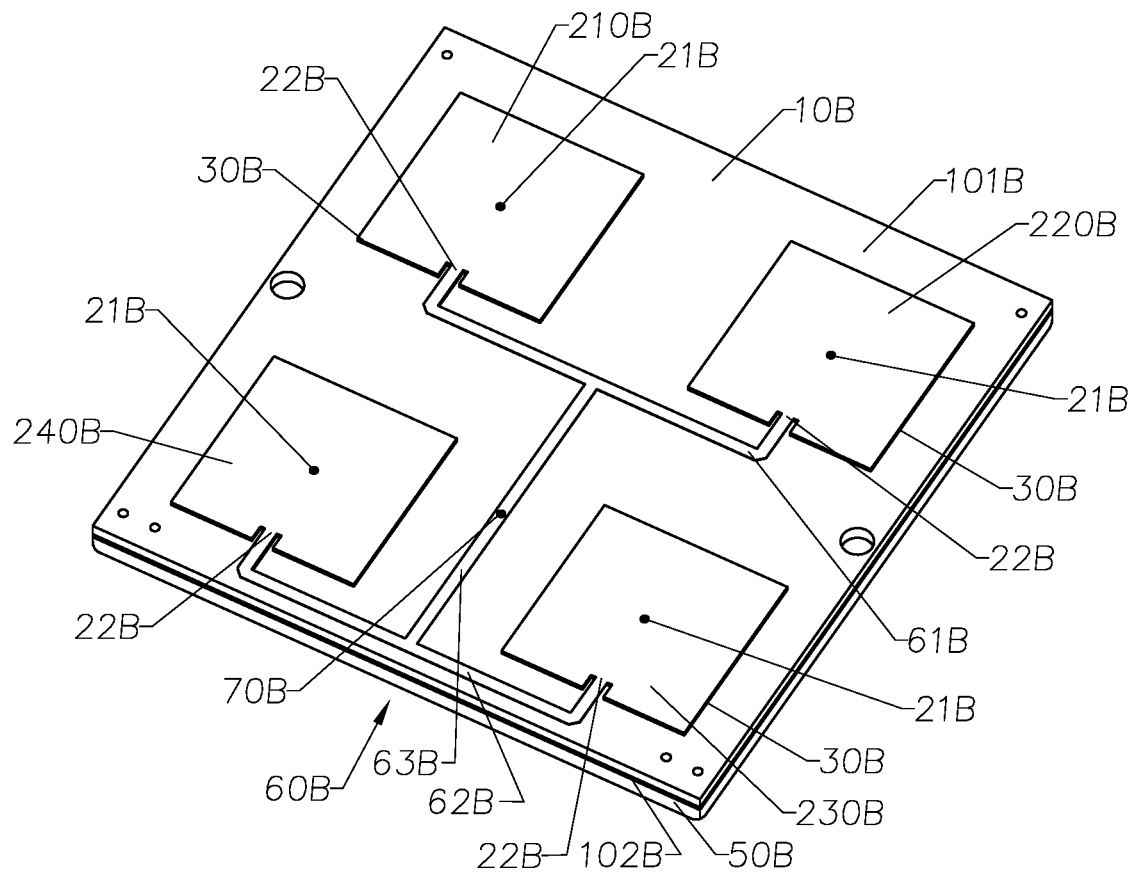
FIG. 11 is a perspective view of an antenna with an anti-interference arrangement according to a third preferred embodiment of the present invention.
Figure 12:
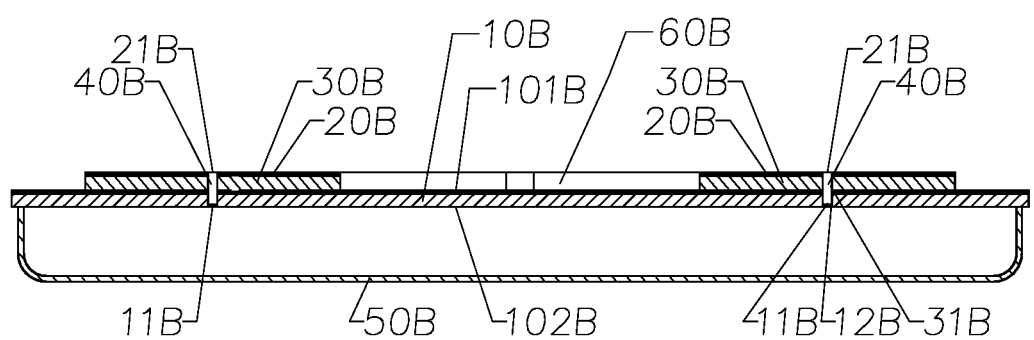
FIG. 12 is a sectional view of the antenna according to the above third preferred embodiment of the present invention.

FIGS. 11 and 12 illustrate a third embodiment of the present invention as another alternative mode thereof, wherein the antenna comprises a reference ground 10B, four radiating sources 20B, and three elongated connectors 60B. The reference ground 10B has a first side 101B and an opposed second side 102B. The four radiating sources 20B are formed in pair and are located adjacent to each other on the first side 101B of the reference ground 10B. The elongated connector 60A is embodied as a micro-connection strip. A radiating clearance 30B is formed at each of the radiating sources 20B and the reference ground 10A. The first elongated connectors 60B has two ends connecting to two adjacent radiating sources 20B in pair. The second elongated connector 60B has two ends connecting to two adjacent radiating sources 20B in another pair. The third elongated connector 60B has two ends connecting between the first and second elongated connectors 60B.

According to the preferred embodiment, the four radiating sources 20B are defined as a first radiating source 210B, a second radiating source 220B, a third radiating source 230B, and a fourth radiating source 240B. The first through fourth radiating sources 210B, 220B, 230B, 240B are orderly located in a clockwise direction. Therefore, the first radiating source 210B is located adjacent to the second and fourth radiating sources 220B, 240B. The third radiating source 230B is located adjacent to the second and fourth radiating sources 220B, 240B. The first radiating source 210B is located opposite to the third radiating source 230B. The second radiating source 220B is located opposite to the fourth radiating source 240B. In addition, the radiating clearance 30B is formed between the first radiating source 210B and the reference ground 10B. The radiating clearance 30B is also formed between the second radiating source 220B and the reference ground 10B. The radiating clearance 30B is also formed between the third radiating source 230B and the reference ground 10B. The radiating clearance 30B is also formed between the fourth radiating source 240B and the reference ground 10B. As it is mentioned above, the three elongated connectors 60B are defined as the first elongated connector 61B, the second elongated connector 62B, and the third elongated connector 63B. The two ends of the first elongated connector 61B are electrically connected to the first and second radiating sources 210B, 220B respectively. The two ends of the second elongated connector 62B are electrically connected to the third and fourth radiating sources 230B, 240B respectively. The two ends of the third elongated connector 63B are electrically connected to the first and second elongated connectors 61B, 62B.

As shown in FIGS. 11 and 12, the first through fourth radiating sources 210B, 220B, 230B, 240B are correspondingly connected to the reference ground 10B, wherein when the excitation current is received by the first through fourth radiating sources 210B, 220B, 230B, 240B, the antenna is initialized at a polarization direction to enable the electromagnetic wave signals received or generated by the antenna.

As shown in FIGS. 11 and 12, each of the first through fourth radiating sources 210B, 220B, 230B, 240B has at least a radiating connection point 21B. The reference ground 10B has at least four reference ground connection points 11A electrically connected to the first through fourth radiating sources 210B, 220B, 230B, 240B respectively.

Each of the first through fourth radiating sources 210B, 220B, 230B, 240B has a feed point 22B to receive the excitation current. Preferably, a distance between the feed point 22B and the radiating connection point 21B of any one of the first through fourth radiating sources 210B, 220B, 230B, 240B is greater than or equal to $\frac{1}{64}\lambda$, where $\lambda$ is the wavelength of the electromagnetic wave signal received or generated by the antenna. Under the excitation of the electromagnetic wave signal, the electromagnetic wave signal will generate the inductance characteristics between the feed point 22B and the radiating connection point 21B of one of the first through fourth radiating sources 210B, 220B, 230B, 240B to provide a predetermine of impedance. The antenna is initialized at a polarization direction to stably generate the radiate energy in a radial and outward direction. At the same time, the inductance characteristics will be generated between the feed point 22B and the radiating connection point 21B and the inductance characteristics will be generated between the elongated connector 60A to lower the impedance of the antenna. Therefore, the bandwidth of the antenna will be narrowed down to prevent the electromagnetic wave signals received or generated by the antenna from being interfered by the nearby electromagnetic radiation frequency or the stray radiation frequency, so as to enhance the anti-interference ability of the antenna.

Furthermore, the feed point 22B of the corresponding radiating source 20B is deviated from a physical center point thereof to lower the amount or intensity of the excitation current for the antenna. In addition, when the excitation current is received by the feed point 22B of the first radiating source 210B, the feed point 22B of the second radiating source 220B, the feed point 22B of the third radiating source 230B, and the feed point 22B of the fourth radiating source 240B, the antenna is easily initialized at a polarization direction.

Preferably, the feed point 22B of the first radiating source 210B is the connection point to connect to the first elongated connector 61B. The feed point 22B of the second radiating source 220B is the connection point to connect to the first elongated connector 61B. The feed point 22B of the third radiating source 230B is the connection point to connect to the second elongated connector 62B. The feed point 22B of the fourth radiating source 240B is the connection point to connect to the second elongated connector 62B.

Furthermore, the antenna further comprises an antenna feed point 70B electrically connected to the third elongated connector 63B. When the excitation current is received at the antenna feed point 70B of the antenna, it passes through the third elongated connector 63B to the feed points 22B of the first through fourth radiating sources 210B, 220B, 230B, 240B via the first and second elongated connectors 61B, 62B. Therefore, the bandwidth of the antenna will be narrowed down to prevent the electromagnetic wave signals received or generated by the antenna from being interfered by the nearby electromagnetic radiation frequency or the stray radiation frequency, so as to enhance the anti-interference ability of the antenna.

In addition, when the first radiating source 210B has one radiating connection point 21B, the radiating connection point 21B of the first radiating source 210B is defined as the physical center point thereof. When the first radiating source 210B has two or more radiating connection points 21B, the physical center point of the first radiating source 210B is surrounded by the radiating connection points 21B thereof. When the second radiating source 220B has one radiating connection point 21B, the radiating connection point 21B of the second radiating source 220B is defined as the physical center point thereof. When the second radiating source 220B has two or more radiating connection points 21B, the physical center point of the second radiating source 220B is surrounded by the radiating connection points 21B thereof. When the third radiating source 230B has one radiating connection point 21B, the radiating connection point 21B of the third radiating source 230B is defined as the physical center point thereof. When the third radiating source 230B has two or more radiating connection points 21B, the physical center point of the third radiating source 230B is surrounded by the radiating connection points 21B thereof. When the fourth radiating source 240B has one radiating connection point 21B, the radiating connection point 21B of the fourth radiating source 240B is defined as the physical center point thereof. When the fourth radiating source 240B has two or more radiating connection points 21B, the physical center point of the fourth radiating source 240B is surrounded by the radiating connection points 21B thereof.

As shown in FIGS. 11 and 12, the antenna further comprises at least four electrical connection elements 40B, wherein at least one of the electrical connection elements 40B has two terminal ends electrically connecting with the radiating connection point 21B of the first radiating source 210B and the reference ground connection point 11B of the reference ground 10B respectively, so as to electrically connect the first radiating source 210B with the reference ground 10B. At least one of the electrical connection elements 40B has two terminal ends electrically connecting with the radiating connection point 21B of the second radiating source 220B and the reference ground connection point 11B of the reference ground 10B respectively, so as to electrically connect the second radiating source 220B with the reference ground 10B. At least one of the electrical connection elements 40B has two terminal ends electrically connecting with the radiating connection point 21B of the third radiating source 230B and the reference ground connection point 11B of the reference ground 10B respectively, so as to electrically connect the third radiating source 230B with the reference ground 10B. At least one of the electrical connection elements 40B has two terminal ends electrically connecting with the radiating connection point 21B of the fourth radiating source 240B and the reference ground connection point 11B of the reference ground 10B respectively, so as to electrically connect the fourth radiating source 240B with the reference ground 10B.

As shown in FIGS. 11 and 12, the antenna further comprises a shield member 50B coupled at the reference ground 10B at the second side 102B thereof.

It is appreciated that different components (elements) as described in the above first, second, third and fourth naming elements should not have any distinguish between different parts, elements, and structures of the present invention. Unless it is specified otherwise, the order or the number of the component should not be limited. Specifically, in this specific example of the antenna shown in FIGS. 11 and 12, the first radiating source 210B, the second radiating source 220B, the third radiating source 230B and the fourth radiating source 240B are only used to describe different locations of the radiation source 20B at different positions of the present invention, which does not refer to the order or the number of the radiation sources 20B.

Figure 13:
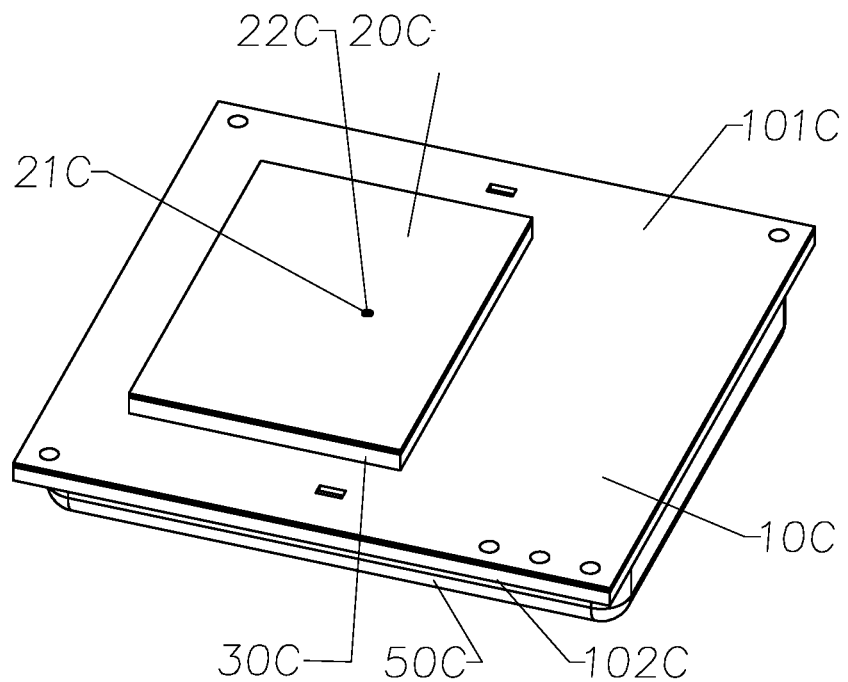
FIG. 13 is a perspective view of an antenna with an anti-interference arrangement according to a fourth preferred embodiment of the present invention.
Figure 14:
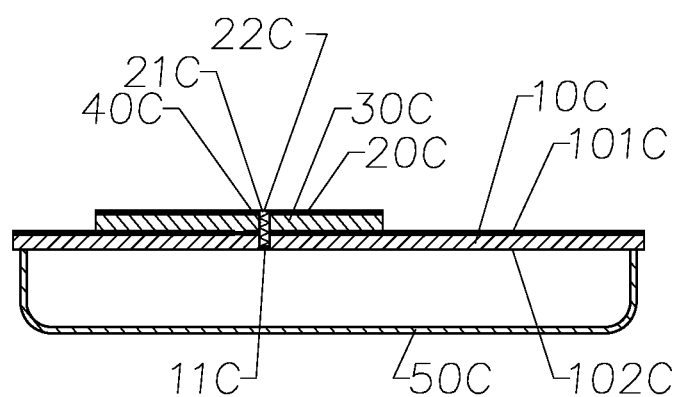
FIG. 14 is a sectional view of the antenna according to the above fourth preferred embodiment of the present invention.

FIGS. 13 and 14 illustrate the fourth embodiment of the present invention as another alternative mode thereof, wherein the antenna comprises a reference ground 10C and at least a radiating source 20C. The radiating source 20C is disposed adjacent to the reference ground 10C to define a radiating clearance 30C between the radiating source 20C and the reference ground 10C. Accordingly, at least one radiating source 20C is electrically connected to the reference ground 10C.

In particular, the reference ground 10C has a first side 101C and an opposed second side 102C, wherein the radiating source 20C is disposed at the first side 101C of the radiating source 20C.

As shown in FIGS. 13 and 14, the radiating source 20C has one radiating connection point 21C and a feed point 22C, wherein the radiating connection point 21C is overlapped with the feed point 22C. The reference ground 10C has at least one reference ground connection point 11C. The antenna further comprises at least an electrical connection element 40B, wherein the electrical connection element 40B preferably is an inductor. The electrical connection element 40C has two terminal ends electrically connecting with the radiating connection point 21C of the radiating source 20C and the reference ground connection point 11C of the reference ground 10C respectively, so as to electrically connect the radiating source 20C with the reference ground 10C via the electrical connection element 40C. For example, the electrical connection element 40C, can be, but not limited to, a curved connection type inductor or a threaded connection type inductor. After the excitation current is received at the feed point 22C of the radiating source 20C, the antenna is initialized at a polarization direction at the radiating source 20C to stably generate the radiate energy in a radial and outward direction. Since the radiating source 20C is electrically connected to the reference ground 10C by the electrical connection element 40C, the impedance of the antenna will be lowered after the excitation current is received at the feed point 22C of the radiating source 20C. Therefore, the bandwidth of the antenna will be narrowed down to prevent the electromagnetic wave signals received or generated by the antenna from being interfered by the nearby electromagnetic radiation frequency or the stray radiation frequency, so as to enhance the anti-interference ability of the antenna.

Figure 15:
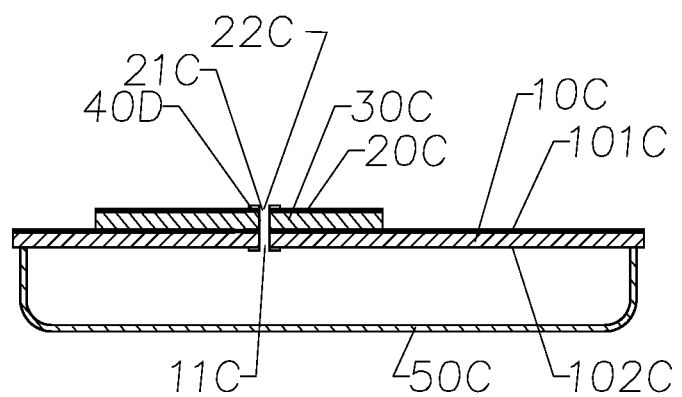
FIG. 15 illustrates an alternative mode of the antenna according to the above fourth preferred embodiment of the present invention.

Alternatively, the radiating source 20C and the reference ground 10C are electrically connected with each other via the electrical connection element 40D, wherein a slot is formed at the reference ground 10C and a metal layer is formed at a wall of the slot to form a metallization slot as the electrical connection element 40D to electrically connect the radiating source 20C with the reference ground 10C as shown in FIG. 15. It is worth mentioning that the feed point of the antenna is electrically connected to the oscillating circuit by the electrical connection element 40D.

According to the preferred embodiment, the present invention further comprises a method of manufacturing the antenna, which comprises the following steps.

(a) Form the radiating clearance 30 between the radiating source 20 and the reference ground 10, wherein the radiating source 20 is spacedly disposed at the first side 101 of the reference ground 10.

(b) Ground the radiating source 20 to form the antenna.

Accordingly, in the step (b), the radiating source 20 is electrically connected to the reference ground 10, such that the radiating source 20 is grounded.

It is worth mentioning that the step (b) can be performed prior to the step (a). In other words, the radiating source 20 is electrically connected to the reference ground 10 first and then the radiating source 20 is spacedly retain at the first side 101 of the reference ground 10.

In the step (a), a solid media is placed on the first side 101 of the reference ground 10, wherein the radiating source 20 is then disposed on the solid media to spacedly retain the radiating source 20 at the reference ground 10 so as to form the radiating clearance 30 between the radiating source 20 and the reference ground 10. Alternatively, the solid media can be placed at the radiating source 20, wherein the solid media is then disposed on the first side 101 of the reference ground 10 to spacedly retain the radiating source 20 at the reference ground 10 so as to form the radiating clearance 30 between the radiating source 20 and the reference ground 10.

The present invention further provides an anti-interference method for the antenna which comprises the steps of: grounding the radiating source 20 to reduce an internal impedance of the antenna; and receiving the excitation current at the feed point 22 of the radiating source 20 to narrow the bandwidth of the antenna, such that any interference of electromagnetic wave signals received or generated by the antenna of the present invention will be substantially reduced in response to the nearby electromagnetic radiation frequency or stray radiation frequency of the adjacent frequency bands.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An antenna, comprising:

a reference ground having a reference ground connection point;

at least a radiating source spacedly disposed at said reference ground that defines a radiating clearance between said radiating source and said reference ground to form an antenna body, wherein said radiating source which is grounded to narrow a bandwidth of said antenna has a radiating connection point electrically connected to said reference ground connection point of said reference ground to ground said radiation source and a feed point for receiving an excitation current to excite said antenna body to generate an electromagnetic wave signal; and an anti-interference circuit electrically connected to said feed point of said radiating source, wherein said anti-interference circuit has a low impendence to enable said excitation current passing through said anti-interference circuit to said feed point of said radiating source, wherein said anti-interference circuit comprises an oscillation circuit module electrically connected to said feed point of said radiating source and a mixing detection circuit module electrically connected to said oscillation circuit module, wherein said oscillation circuit module comprises a triode circuit processor, an inductor, a first resistor, a second resistor, a first capacitor, a second capacitor, a third capacitor, a fourth capacitor and a fifth capacitor, wherein said triode circuit processor comprises a first connection terminal, a second connection terminal, and a third connection terminal, wherein one end of said inductor is electrically connected to a power source while another end of said inductor is electrically connected to said first connection terminal of said triode circuit processor, wherein one end of said first resistor is electrically connected to said first connection terminal of said triode circuit processor while another end of said first resistor is electrically connected to said second connection terminal of said triode circuit processor, wherein one end of said first capacitor is electrically connected to said second connection terminal of said triode circuit processor while another end of said first capacitor is electrically connected to one end of said second capacitor, wherein another end of said second capacitor is electrically connected to a ground point, wherein one end of said third capacitor is electrically connected to said first connection terminal of said triode circuit processor while another end of said third capacitor is electrically connected to said third connection terminal of said triode circuit processor, wherein one end of said second resistor is electrically connected to said third connection terminal of said triode circuit processor while another end of said second resistor is electrically connected to said ground point, wherein one end of said fourth capacitor is electrically connected to said third connection terminal of said triode circuit processor while another end of said fourth capacitor is electrically connected to one end of said fifth capacitor, wherein another end of said fifth capacitor is electrically connected to said feed point of said radiating source.

2. The anti-interference microwave antenna, as recited in claim 1, wherein said mixing detection circuit module comprises a first diode and a second diode, wherein one end of said first diode and one end of the second diode are connected to a signal output terminal while another end of said first diode and another end of said second diode are connected to said ground point.

3. An antenna, comprising:
a reference ground having a reference ground connection point;
at least a radiating source spacedly disposed at said reference ground that defines a radiating clearance between said radiating source and said reference ground to form an antenna body, wherein said radiating source which is grounded to narrow a bandwidth of said antenna has a radiating connection point electrically connected to said reference ground connection point of said reference ground to ground said radiation source and a feed point for receiving an excitation current to excite said antenna body to generate an electromagnetic wave signal;
an anti-interference circuit electrically connected to said feed point of said radiating source; and
an elongated connector and two or more electrically connection elements, wherein said at least one radiating source comprises two or more radiating sources, wherein said elongated connector is electrically connected with two of said two or more radiating sources and said radiation clearance is formed between each of said two or more radiation sources and said reference ground, wherein said feed point is provided at one of said two or more radiating sources forming a primary radiating source while another said two or more radiating sources does not contain any feed point to form a secondary radiating source, wherein said reference ground has two or more reference ground connection points, wherein one of said two or more electrical connection elements has two terminal ends electrically connecting with a radiating connection point of said primary radiating source and one of said two or more reference ground connection points of said reference ground respectively to electrically ground said primary radiating source, wherein another of said two or more electrical connection element has two terminal ends electrically connecting with said radiating connection point of said secondary radiating source and another one of said two or more reference ground connection points of said reference ground respectively to electrically ground said secondary radiating source.

4. An anti-interference microwave antenna for moving object detection, comprising:
a reference ground having a reference ground connection point, a first side and an opposed second side, wherein said reference ground connection point is formed at said second side of said reference ground; and
at least one radiating source spacedly disposed at said reference ground that defines a radiating clearance between said radiating source and said reference ground to form an antenna body, wherein said radiating source is spacedly disposed on said first side of said reference ground to form said radiating clearance between said first side of said reference ground and said radiating source, wherein said radiating source has a radiating connection point electrically connected to said reference ground connection point of said reference ground to ground said radiating source and a feed point for receiving an excitation current to excite said antenna body to generate an electromagnetic wave signal, wherein said radiating connection point is a physical center point of said radiating source, wherein said feed point is deviated from said radiating connection point for a distance for receiving an excitation current, wherein an impedance, generated between said radiating connection point and said feed point, between said radiating source and said reference ground of said antenna excites said radiating source and is lowered to narrow a bandwidth of said antenna for enhancing an ability of preventing electromagnetic wave signals received or generated by said antenna from being interfered by any of electromagnetic radiation frequency and stray radiation frequency and a radiating energy of primary radiating wave within a radiating wave band thereof to reduce a harmonic radiation of said antenna.

5. The anti-interference microwave antenna, as recited in claim 4, wherein said distance between said radiating connection point and said feed point of said radiating source is greater than or equal to $\frac{1}{64}\lambda$, where $\lambda$ is a wavelength of said electromagnetic wave signal.

6. The anti-interference microwave antenna, as recited in claim 5, wherein said radiating source further has one or more radiating connection points provided surrounding said radiating connection point at said physical center point of said radiating source.

7. The anti-interference microwave antenna, as recited in claim 6, further comprising an electrical connection element having two terminal ends electrically connecting with said radiating connection point of said radiating source and said reference ground connection point of said reference ground respectively to electrically connect said radiating source with said reference ground.

8. The anti-interference microwave antenna, as recited in claim 7, wherein said electrical connection element is in fluid state being filled in said radiating clearance and is then solidified to electrically connect said radiating source with said reference ground.

9. The anti-interference microwave antenna, as recited in claim 6, further comprising a shield member coupled at said second side of said reference ground.

10. The anti-interference microwave antenna, as recited in claim 4, further comprising an electrical connection element having two terminal ends electrically connecting with said radiating connection point of said radiating source and said reference ground connection point of said reference ground respectively to electrically connect said radiating source with said reference ground, wherein said reference ground further has a reference ground slot formed at said second side of said reference ground and extended to said radiating source, wherein said radiating connecting point of said radiating source is set at said reference ground slot of said reference ground.

11. The anti-interference microwave antenna, as recited in claim 5, further comprising an electrical connection element having two terminal ends electrically connecting with said radiating connection point of said radiating source and said reference ground connection point of said reference ground respectively to electrically connect said radiating source with said reference ground.

12. The anti-interference microwave antenna, as recited in claim 4, wherein said radiating source further has one or more radiating connection points provided surrounding said radiating connection point at said physical center point of said radiating source.

13. The anti-interference microwave antenna, as recited in claim 4, wherein said radiating connection point is overlapped with said feed point.

14. An antenna, comprising:

a reference ground having a reference ground connection point;

at least a radiating source spacedly disposed at said reference ground that defines a radiating clearance between said radiating source and said reference ground to form an antenna body, wherein said radiating source which is grounded to narrow a bandwidth of said antenna has a radiating connection point electrically connected to said reference ground connection point of said reference ground to ground said radiation source and a feed point for receiving an excitation current to excite said antenna body to generate an electromagnetic wave signal; and an anti-interference circuit electrically connected to said feed point of said radiating source, wherein said at least one radiating source comprises two or more radiating sources and said anti-interference microwave antenna further comprises an elongated connector electrically connecting with two of said two or more radiating sources, wherein said radiation clearance is formed between each of said two or more radiation sources and said reference ground, wherein said reference ground further has one or more additional reference ground connection points, wherein said radiating connection points of said two or more radiating sources are electrically connected to said reference connection points of said reference ground and said one or more additional reference ground connection points respectively, wherein said feed point is provided at one of said two or more radiating sources form a primary radiating source while another said two or more radiating sources does not contain any feed point to form a secondary radiating source, wherein two ends of said elongated connector are electrically connected to said primary radiating source and said secondary radiating source, wherein said elongated connector is arranged for passing said excitation current from said primary radiating source to said secondary radiating source after said feed point of said primary radiating source receives said excitation current, such that said antenna body is excited to generate said electromagnetic wave signal.

15. The anti-interference microwave antenna, as recited in claim 14, wherein said distance between said feed point and said radiating connection point of said primary radiating source is greater than or equal to $\frac{1}{64}\lambda$, where $\lambda$ is a wavelength of said electromagnetic wave signal.

* * * * *